United States Patent
Lin et al.

(10) Patent No.: US 11,799,483 B2
(45) Date of Patent: Oct. 24, 2023

(54) MULTI-MODE STANDARD CELL LOGIC AND SELF-STARTUP FOR BATTERY-INDIFFERENT OR PURE ENERGY HARVESTING SYSTEMS

(71) Applicant: NATIONAL UNIVERSITY OF SINGAPORE, Singapore (SG)

(72) Inventors: Longyang Lin, Singapore (SG);
Saurabh Jain, Singapore (SG);
Massimo Alioto, Singapore (SG)

(73) Assignee: NATIONAL UNIVERSTY OF SINGAPORE, Singapore (SG)

( * ) Notice: Subject to any disclaimer, the term of this patent is extended or adjusted under 35 U.S.C. 154(b) by 0 days.

(21) Appl. No.: 17/516,233

(22) Filed: Nov. 1, 2021

(65) Prior Publication Data

US 2022/0052693 A1    Feb. 17, 2022

Related U.S. Application Data

(62) Division of application No. 16/968,339, filed as application No. PCT/SG2019/050075 on Feb. 8, 2019, now Pat. No. 11,196,422.

(30) Foreign Application Priority Data

Feb. 9, 2018    (SG) .......................... 10201801131X

(51) Int. Cl.
*H03K 19/00* (2006.01)
*H03K 19/0948* (2006.01)
(Continued)

(52) U.S. Cl.
CPC ....... *H03K 19/0948* (2013.01); *H03K 17/161* (2013.01); *H03K 19/0013* (2013.01); *H03K 19/0185* (2013.01)

(58) Field of Classification Search
CPC ............. H03K 17/161; H03K 19/0013; H03K 19/0185; H03K 19/0948
See application file for complete search history.

(56) References Cited

U.S. PATENT DOCUMENTS 6,255,867 B1    7/2001 Chen
8,294,492 B2    10/2012 Bol
(Continued)

FOREIGN PATENT DOCUMENTS

CN    1656681 A    8/2005
CN    102016749 A    4/2011
(Continued)

OTHER PUBLICATIONS

Rohit Lorenzo and Saurabh Chaudhury, Dynamic Threshold Sleep Transistor Technique for High Speed and Low Leakage in CMOS Circuits, Oct. 24, 2016, Circuits Syst Signal Process (2017) 36:2654-2671 (Year: 2016).*
(Continued)

*Primary Examiner* — Kurtis R Bahr
(74) *Attorney, Agent, or Firm* — Volpe Koenig

(57) ABSTRACT

A cell logic structure for a battery-indifferent or pure energy harvesting multi-mode system, a battery-indifferent or pure energy harvesting multi-mode system, a method of operating a cell logic structure for a battery-indifferent or pure energy harvesting multi-mode system, and a method of operating battery-indifferent or pure energy harvesting multi-mode system. The cell gate structure comprises a CMOS gate circuit; a header circuit coupled to the CMOS gate circuit and comprising first and second header transistors for coupling in parallel between a supply voltage and the CMOS gate circuit; and a footer circuit coupled to the CMOS gate circuit and comprising first and second footer transistors for coupling in parallel between the CMOS gate circuit and a ground voltage; wherein the header and footer
(Continued)

circuits are configured for switching between different operation modes of the multi-mode system, the different operation modes chosen from a range from a normal mode in which feedback paths from an output of the CMOS gate circuit to the gate of the second header transistor and to the gate of the second footer transistor are substantially or fully disabled for full swing in the output voltage of the CMOS gate circuit, and a leakage suppression mode in which the feedback paths are substantially or fully enabled.

8 Claims, 12 Drawing Sheets

(51) Int. Cl.
*H03K 17/16* (2006.01)
*H03K 19/0185* (2006.01)

(56) References Cited

U.S. PATENT DOCUMENTS

| | | | |
|---|---|---|---|
| 8,581,637 | B2 | 11/2013 | Paul |
| 2003/0218478 | A1 | 11/2003 | Sani |
| 2013/0027123 | A1* | 1/2013 | Idgunji ............ H03K 19/0016 327/543 |

FOREIGN PATENT DOCUMENTS

| | | |
|---|---|---|
| CN | 203071897 A | 7/2013 |
| FI | 20150294 A | 4/2017 |
| JP | H02-179121 A | 7/1990 |
| JP | H05-114853 A | 5/1993 |
| JP | H05-183421 A | 7/1993 |
| JP | 2014-168131 A | 9/2014 |
| WO | 0016483 A1 | 3/2000 |
| WO | 2005057628 A2 | 6/2005 |
| WO | 2017068233 A1 | 4/2017 |

OTHER PUBLICATIONS

Bol, D., et al. "A 25MHz 7µW/MHz Ultra-Low-Voltage Microcontroller SoC in 65nm LP/GP CMOS for Low-Carbon Wireless Sensor Nodes" ISSCC, pp. 490-491, 2012.

Lee, Y., et al. "A Modular 1mm3 Die-Stacked Sensing Platform with Optical Communication and Multi-Modal Energy Harvesting" ISSCC, pp. 402-403, 2012.

Lim, W., et al. "Batteryless Sub-nW Cortex-M0+ Processor with Dynamic Leakage-Suppression Logic" ISSCC, pp. 146-147, 2015.

Lin, L., et al. "A 595pW 14pJ/Cycle microcontroller with dual-mode standard cells and self-startup for battery-indifferent distributed sensing" 2018 IEEE International Solid-State Circuits Conference (ISSCC), Feb. 12, 2018. pp. 44-46.

Myers, J., et al. "An 80nW Retention 11.7pJ/Cycle Active Sub-threshold ARM Cortex-M0+ Subsystem in 65nm CMOS for WSN Applications" ISSCC, pp. 144-145, 2015.

Paul, S., et al. "A Sub-cm3 Energy-Harvesting Stacked Wireless Sensor Node Featuring a Near-Threshold Voltage IA-32 Microcontroller in 14-nm Tri-Gate CMOS for Always-On Always-Sensing Applications" IEEE JSSC, vol. 52, No. 4, pp. 961-971, 2017.

Reyserhove, H. et al., "A Differential Transmission Gate Design Flow for Minimum Energy Sub-10-pJ/Cycle ARM Cortex-M0 MCUs" IEEE JSSC, vol. 52, No. 7, pp. 1904-1914, 2017.

Office Action issued in corresponding Chinese Patent Application No. 201980012202.9 dated May 31, 2023, consisting of 37 pp. (English Translation Provided).

"Dynamic Threshold Sleep Transistor Technique for High Speed and Low Leakage in CMOS Circuits", Rohit Lorenzo, Circuits Syst Signal Process (2017), 2654-2671.

* cited by examiner

MULTI-MODE STANDARD CELL LOGIC AND SELF-STARTUP FOR BATTERY-INDIFFERENT OR PURE ENERGY HARVESTING SYSTEMS

FIELD OF INVENTION

The present invention relates broadly to the field of solid-state circuits and systems (CMOS), in particular to multi-mode cell logic and self-startup for battery-indifferent or pure energy harvesting systems.

BACKGROUND

Any mention and/or discussion of prior art throughout the specification should not be considered, in any way, as an admission that this prior art is well known or forms part of common general knowledge in the field.

Battery-indifferent systems such as, but no limited to, sensor nodes require continuous operation in spite of the intermittently available battery energy, and hence require low peak-power operation to fit the fluctuating power made available by the harvester when the battery is out of energy. FIG. 1 shows a chart illustrating that battery-indifferent operation of sensor nodes with an integrated harvester need to achieve sub-nW power (minimum power) when the battery is out of energy, see purely harvested operation mode 100, while reducing energy when battery-powered (minimum energy) in various battery operated modes 101-103. Such harvested power can be very limited (e.g., nW and below) in aggressively miniaturized systems in the millimeter scale, and is typically well below the leakage consumption of the circuit being powered.

Recently, purely harvested continuous operation with an on-chip harvester with sub-leakage sub-nW minimum power has been demonstrated for battery-less operation [1], at the cost of drastically lower performance (i.e., clock frequency in the Hz range) and larger energy. On the other hand, conventional miniaturized sensor nodes pursue minimum energy per operation to maximize the battery lifetime [2-6], but are not able to operate in the sub-leakage regime, and are hence unsuitable for purely harvested operation.

"Semiconductor device with reduced leakage current and method for manufacture the same" (Cold Brick Semiconductor, Inc., 2013), US 20130107651 A1 proposes separate header and footer based approach to reduce leakage in custom standard cells, however there are 8 additional transistors required in each standard cell and therefore larger area.

"Ultra-low-power circuit" (Universite Catholique de Louvain (UCL)), U.S. Pat. No. 8,294,492 B2 proposes to integrate one header and one footer controlling by the output of custom standard cells to reduce leakage current, however the speed of the custom standard cells is heavily degraded.

Embodiments of the present invention seek to address at least one of the above problems.

SUMMARY

In accordance with a first aspect of the present invention, there is provided a cell logic structure for a battery-indifferent or pure energy harvesting multi-mode system, the cell gate structure comprising:
a CMOS gate circuit;
a header circuit coupled to the CMOS gate circuit and comprising first and second header transistors for coupling in parallel between a supply voltage and the CMOS gate circuit; and
a footer circuit coupled to the CMOS gate circuit and comprising first and second footer transistors for coupling in parallel between the CMOS gate circuit and a ground voltage;
wherein the header and footer circuits are configured for switching between different operation modes of the multi-mode system, the different operation modes chosen from a range from a normal mode in which feedback paths from an output of the CMOS gate circuit to the gate of the second header transistor and to the gate of the second footer transistor are substantially or fully disabled for full swing in the output voltage of the CMOS gate circuit, and a leakage suppression mode in which the feedback paths are substantially or fully enabled.

In accordance with a second aspect of the present invention, there is provided a battery-indifferent or pure energy harvesting multi-mode system comprising:
an energy harvesting circuit for generating power for the multi-mode system;
one or more cell logic structures of the first aspect; and
a power management circuit for switching between the different operation modes of the multi-mode system.

In accordance with a third aspect of the present invention, there is provided a method of operating a cell logic structure for a battery-indifferent or pure energy harvesting multi-mode system, the method comprising the steps of:
controlling a header circuit coupled to a CMOS gate circuit, the header circuit comprising first and second header transistors for coupling in parallel between a supply voltage and the CMOS gate circuit, and
controlling a footer circuit coupled to the CMOS gate circuit, the footer circuit comprising first and second footer transistors for coupling in parallel between the CMOS gate circuit and a ground voltage;
such that the multi-mode system is switchable between different operation modes, the different operation modes chosen from a range from a normal mode in which feedback paths from an output of the CMOS gate circuit to the gate of the second header transistor and to the gate of the second footer transistor are substantially or fully disabled for full swing in the output voltage of the CMOS gate circuit, and a leakage suppression mode in which the feedback paths are substantially or fully enabled.

In accordance with a fourth aspect of the present invention, there is provided a method of operating a battery-indifferent or pure energy harvesting multi-mode system, comprising the steps of:
generating power for the multi-mode system using an energy harvesting circuit;
executing the method of the third aspect; and
switching between the different operation modes of the multi-mode system.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Embodiments of the present invention provide a novel logic family and self-startup scheme for semiconductor Integrated Chips (ICs), including but not limited to standard cell design for digital integrated circuits, based on the concept of dual-mode logic (DML) and ripple power gating self-startup (RPG). The DML allows digital systems to operate both in normal (NM) and leakage suppression mode (LSM). In NM mode, it allows the system to work in a very high energy efficient manner with decent speed. In LSM mode, the system works with only sub-leakage power (i.e., below 1 nW) which can operate even without battery. The RPG self-startup scheme enables cold start at reduced harvested power, overcoming the need for large harvested power peak in [1] at start-up. In example embodiments, instead of PMOS headers, NMOS header and PMOS footers are used per cell and can operate at super-cutoff (negative gate overdrive) in sleep mode and can completely cut off the leakage path from supply.

In one embodiment, an example of a microcontroller using DML standard cells and RPG self-startup is presented. The standard cells are configured as conventional CMOS gates in NM mode, whereas they are configured as dynamic leakage-suppression (DLS) logic [1] in LSM mode, so that their current is pushed below leakage. When the battery or harvested power is sufficient, the system according to an example embodiment operates in NM mode with high energy efficiency and performance. When the battery is out of energy and under limited harvested power (e.g., solar cell at dim light), the system according to an example embodiment is configured in LSM mode to operate at sub-leakage power. In RPG self-startup, instead of powering up the entire system all at once, the system is partitioned in smaller power domains that are sequentially powered by the ripple self-startup according to an example embodiment, which progressively turns on the relevant header sleep transistors. A prototype embodiment has been manufactured and proven by silicon measurement results.

The described DML and RPG are discussed for microcontrollers, but it will be appreciated that they are not limited to microcontrollers, but can be applied to other digital integrated circuits (e.g., digital signal processors).

Figure 1:
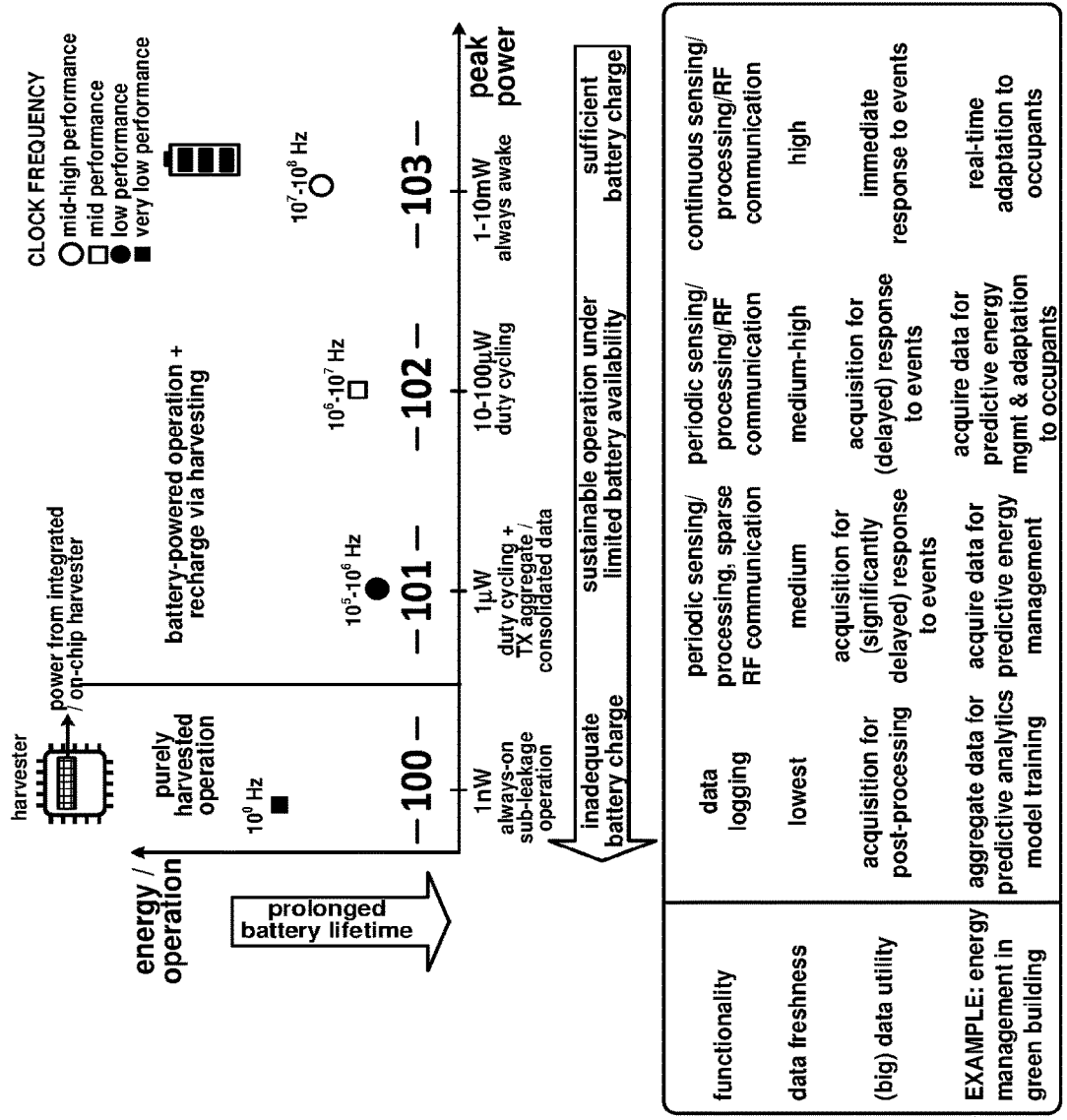
FIG. 1 illustrates battery-indifferent operation of sensor nodes with an integrated harvester needing to achieve sub-nW power (minimum power) when the battery is out of energy, while reducing energy when battery-powered (minimum energy).
Figure 2:
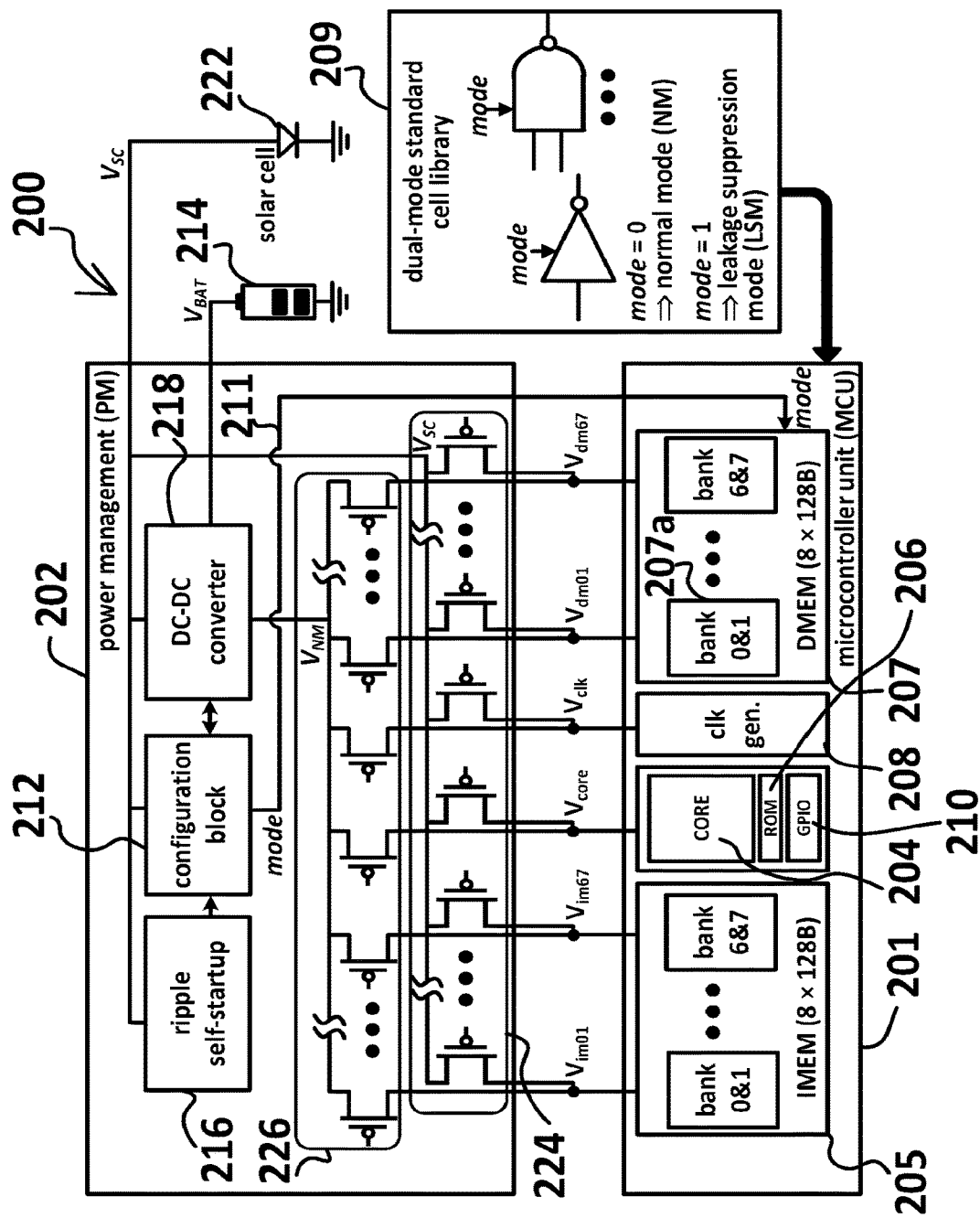
FIG. 2 shows a schematic diagram illustrating a dual-mode system architecture according to an example embodiment, comprising microcontroller and power management, and which can preferably operate in normal (minimum energy) or leakage suppression mode (minimum power) modes.

As mentioned above, in one embodiment, the DML and ripple power gating self-startup was implemented in a typical digital system 200 consisting of a microcontroller (MCU) unit 201 and a power management (PM) sub-system 202, as shown in FIG. 2. The microcontroller unit 201 according to this example embodiment has a processor core 204, 1 KB latch-based instruction memory (IMEM) 205 and data memory (DMEM) 207 (each having four separately power-gated sections e.g. 205a, 207a), 128B synthesized boot ROM 206, an on-chip clock generator 208, and a GPIO interface 210 for communication with sensors and other peripherals. The MCU unit 201 is designed with a multi-mode, e.g. a dual-mode, standard cell library 209, described in more detail below with reference to FIG. 3, which is configured in either NM or LSM mode depending on the mode signal 211 generated by the power mode configuration block 212, based on the battery 214 condition. It is noted that the term "standard cell" is used because the cells can be used by electronic design automation (EDA) tools for place and routing. The PM sub-system 202 includes a ripple self-startup circuit 216, a DC-DC converter 218, and the power-mode configuration block 212. The power-mode configuration block 212 generates the signals to turn on/off the self-startup circuit 216, the DC-DC converter 218, and, based on the mode signal 211, the power gating signals to the cell library 209. When the battery 214 is available, the system 200 operates in normal mode with high energy efficiency and performance. When the battery 214 is out of energy and under limited harvested power (e.g., solar cell 222 at dim light), the system 200 is configured in LSM mode to operate at sub-leakage power. Sets of sleep transistors e.g. 224, 226 are provided as part of the MP sub-system 202. Specifically, the lower set of PMOS headers e.g. 224 are used to sequentially turn on power domains in purely harvested mode, as will be described in more detail below. The top set of PMOS headers e.g. 226 are used to turn off any unused power domain in battery powered mode to further reduce the energy consumption, in an example embodiment.

Figure 3:
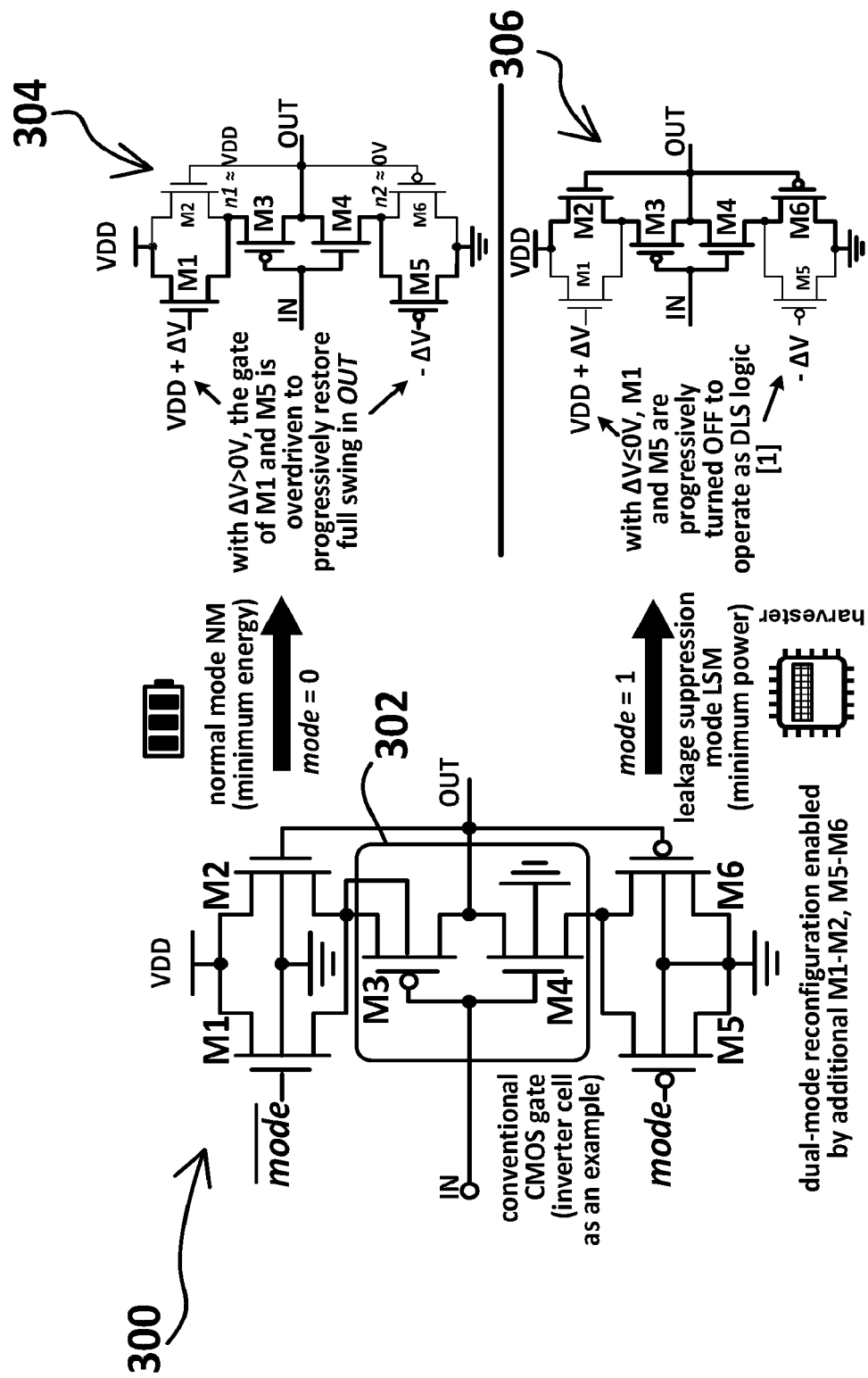
FIG. 3 shows a circuit diagram illustrating a cell logic structure for a battery-indifferent dual-mode system according to an example embodiment, here a dual-mode inverter and its operation in normal and leakage suppression mode.

FIG. 3 shows the operation of the proposed dual-mode cells e.g. 300 for the cell library 209 (FIG. 2), where four extra transistors (M1, M2, M5, M6) are added to a conventional CMOS gate 302 (inverter gate, in this example embodiment). When mode=0 (i.e., NM mode), M1 and M5 are turned on and boosted by $\Delta V$ to pull up node n1 to $V_{DD}$ (pull down n2 to ground), which disables the feedback paths from transistors M2 and M6, and allows conventional CMOS gate operation, compare NM configuration 304.

Figure 4:
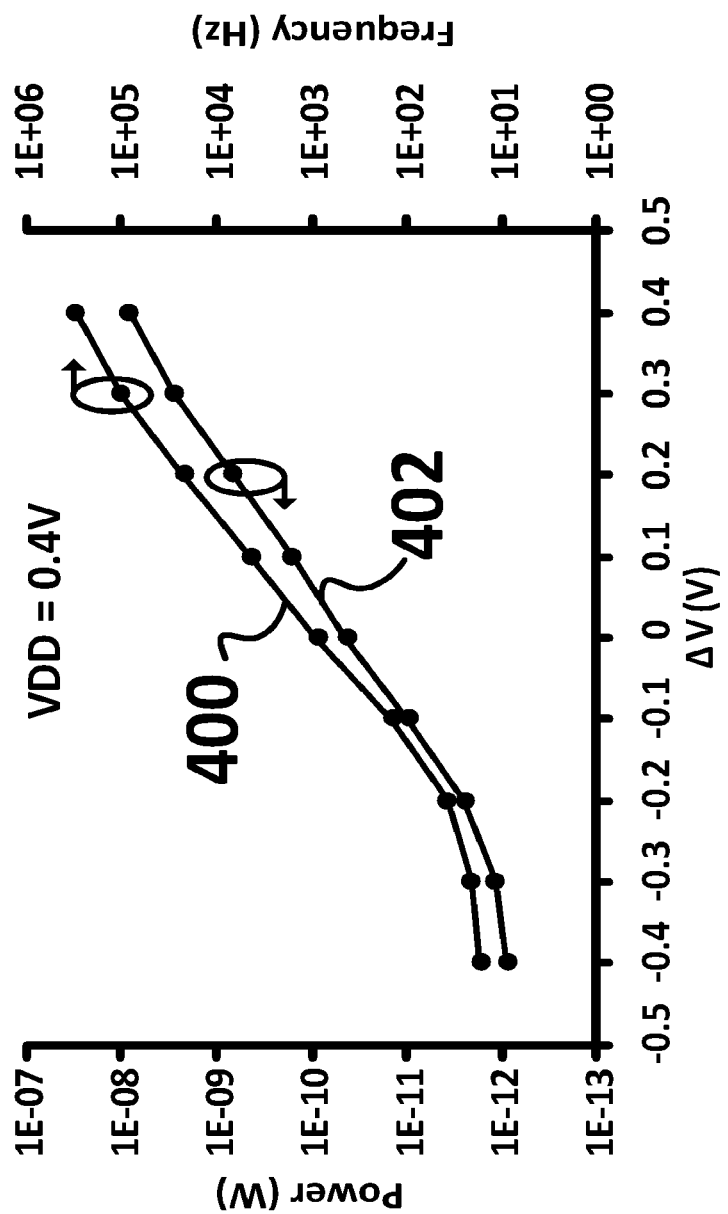
FIG. 4 shows a graph illustrating power/frequency versus tuning voltage ($\Delta V$) in normal mode operation and normal mode operation of the dual-mode inverter of FIG. 3

Voltage boosting by $\Delta V=0.4V$ in NM mode was found to be sufficient in this example embodiment to compensate the threshold voltage drop of M1 and M5, and is delivered by the DC-DC converter 218 (FIG. 2), which is powered by the battery 214 (FIG. 2) in this mode. In addition, $\Delta V$ can be used as a modulating knob for trading off power for higher operational frequency and better energy efficiency under a given $V_{DD}$. As shown in FIG. 4 for $V_{DD}=0.4V$, it can achieve almost 5 orders of magnitude tuning in frequency (curve 400) and power (curve 402) by setting $\Delta V$ from $V_{DD}$ to 0.4V. It is noted that embodiments of the present invention advantageously have the ability to achieve all/any intermediate power-performance trade-offs as well. That is, in addition to the two (very far away) design points defining a continuous range from a minimum energy to a minimum power operation mode, embodiments of the present invention are able to achieve any intermediate trade-off by tuning $\Delta V$, see FIG. 4. In that regard, the two design points at minimum energy and minimum power as described for the dual-mode embodiments are only by way of example, not limitation. In different embodiments, two or more design points can be chosen for the different modes of a multi-mode system from the continuous range of design points, such as illustrated in FIG. 4. Returning to FIG. 3, when mode=1 (i.e., LSM mode), M1 and M5 are off ($\Delta V=-V_{DD}$) and the inverter operates as DLS logic [1], compare LSM configuration 306, advantageously assuring minimum (sub-leakage) power thanks to the reverse gate biasing of M1-M6 (i.e., super-cutoff). More generally, with $\Delta V>0V$, the gate of M1 and M5 is overdriven to progressively restore full swing in OUT. On the other hand, with $\Delta V \leq 0$ V, M1 and M5 are progressively turned OFF to operate as DLS logic [1].

Figure 5:
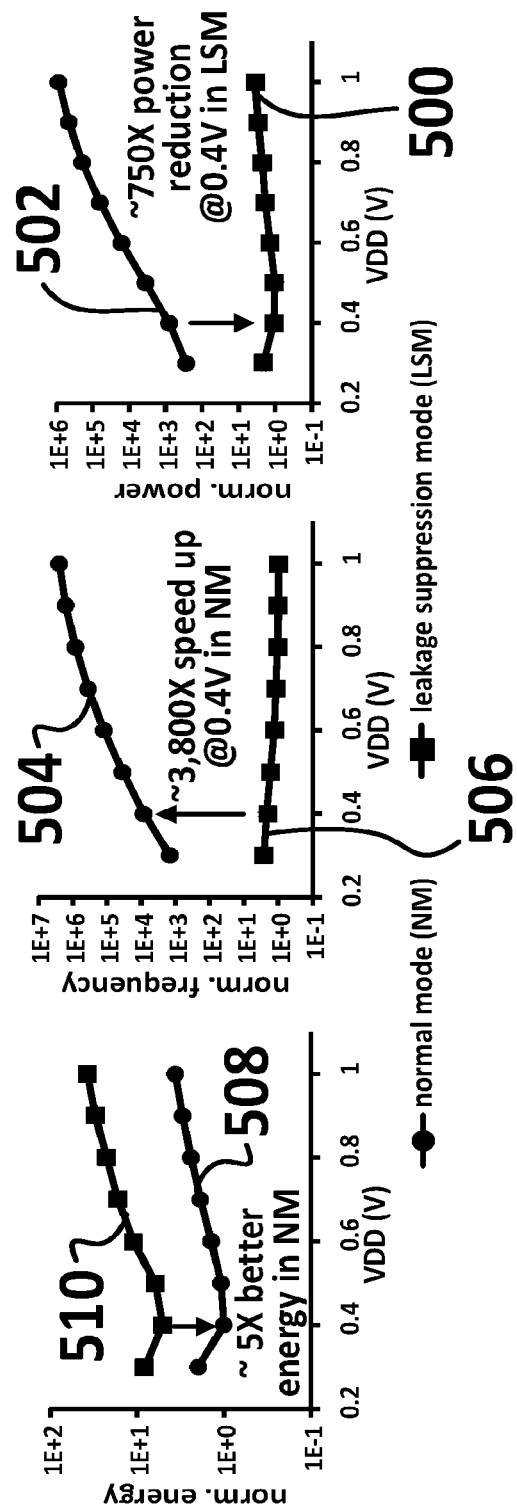
FIG. 5 shows a graph illustrating measured energy versus $V_{DD}$ (left), a graph illustrating measured frequency versus $V_{DD}$ (middle), and a graph illustrating measured power versus $V_{DD}$ (right) of a dual-mode 35-stage ring oscillator according to an example embodiment.

In the measurement of a 35-stage ring oscillator according to an example embodiment (FIG. 5), LSM mode (curve 500) shows 750× power reduction at 0.4V compared to NM mode (curve 502), while NM mode (curve 504) exhibits 3,800× speed-up compared to LSM mode (curve 506) and while NM mode (curve 508) shows 5× energy reduction compared to LSM mode (curve 510). Based on this principle, a dual-mode standard cell library 209 (FIG. 2) is designed according to an example embodiment.

Figure 6:
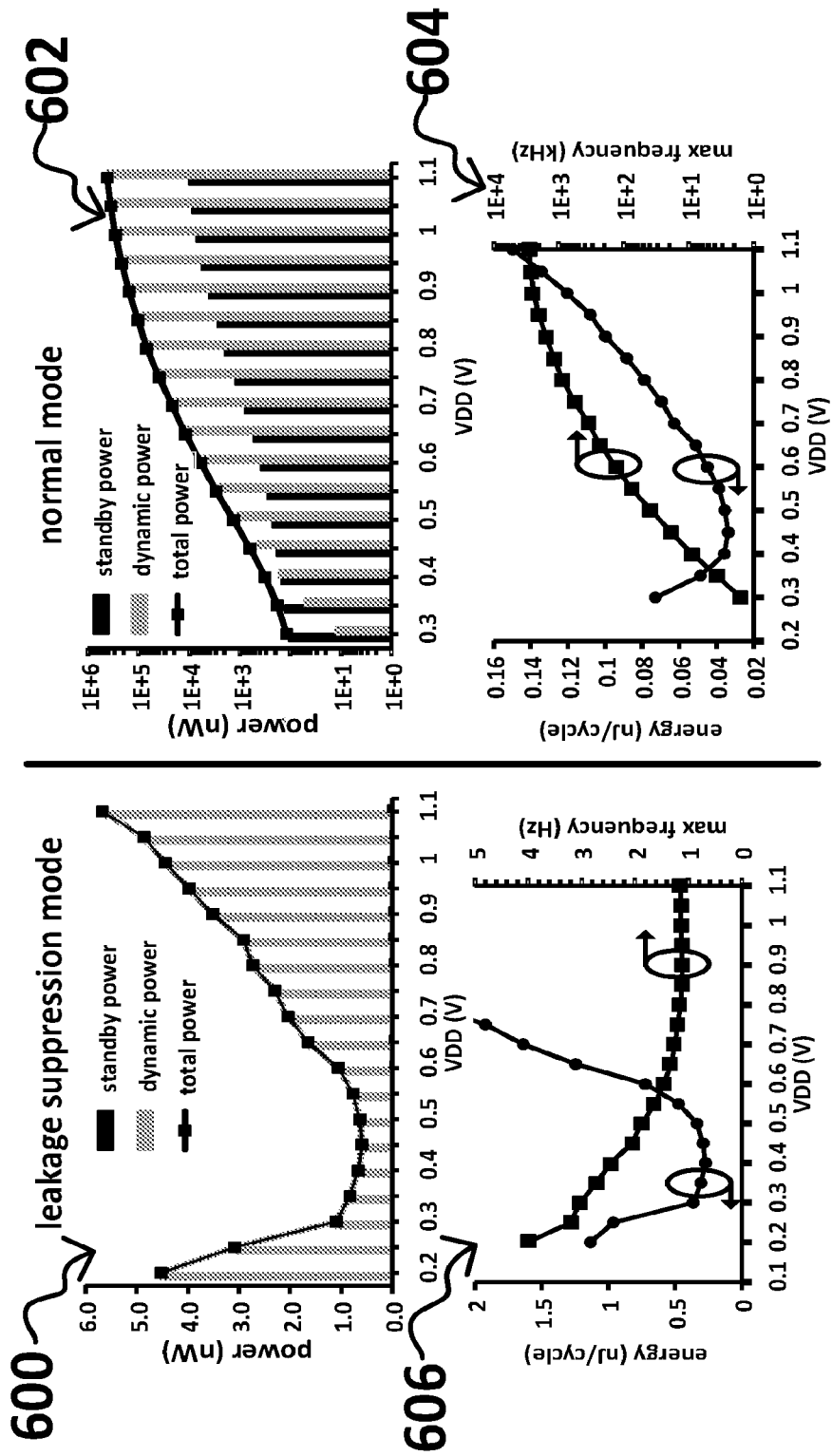
FIG. 6 shows graphs illustrating measured power (top) and energy (bottom) of a microcontroller system according to an example embodiment in LSM (left) and NM (right), when running a program computing the moving average of an input acquired through the GPIO (entire 2 KB memory is active, T=25° C.).

In FIG. 6, measurements on the dual-mode microcontroller system according to an example embodiment designed with the above described dual-mode standard cell library and an automated design flow show that the minimum-power point in LSM mode occurs at 0.45V and is 595 pW as shown graph 600, which is 198× lower than the minimum power point in normal mode as shown in graph 602. When running a moving average program, the minimum energy point in NM mode is 33 pJ/cycle at 0.45V with fully enabled memory banks (14 pJ/cycle when using 512B memory, with other banks being power gated) as shown in graph 604, which is 8.2× (19.4×) lower energy than in LSM mode as shown in graph 606. At the same minimum energy point, the MCU system according to this example embodiment runs at 19 kHz as shown in graph 604, which is 7,755× faster than in LSM mode as shown in graph 606. From the results shown in FIG. 6, the dual-mode reconfiguration according to this example embodiment can advantageously break the tradeoff between minimum-power and minimum-energy encountered in conventional single-mode systems. Compared to a conventional CMOS design, LSM mode of the dual-mode reconfiguration system according to this example embodiment reduces power down to sub-nW range like DLS logic [1]. Conversely and advantageously, NM mode of the dual-mode reconfiguration system according to this example embodiment avoids the drastic speed (7,755×) and energy (8.2×) degradation of DLS.

Although operation in LSM mode reduces the current drawn by the MCU system according to example embodiment to the nA range once bootstrapped, the DC current absorbed when the harvester voltage is progressively raised is much larger, as was observed in [1] for DLS logic. For example, as shown in graphs 600 and 606 in FIG. 6 the current (power) at $V_{DD}=0.2V$ in LSM mode is 17.1× (7.6×) larger than the value at the minimum-power point $V_{DD}=0.45V$, because transistors in DLS cells are less negatively gate biased at lower $V_{DD}$, and hence draw an exponentially larger current than at the minimum-power point [1]. This issue was addressed in [1] by requiring the harvester power to be significantly raised at power-up, and then allowed to be smaller during in-field operation. However, this limits the ability of the system to boot up again after a harvesting power outage, as it will not boot until a large harvested power becomes available again.

Figure 7:
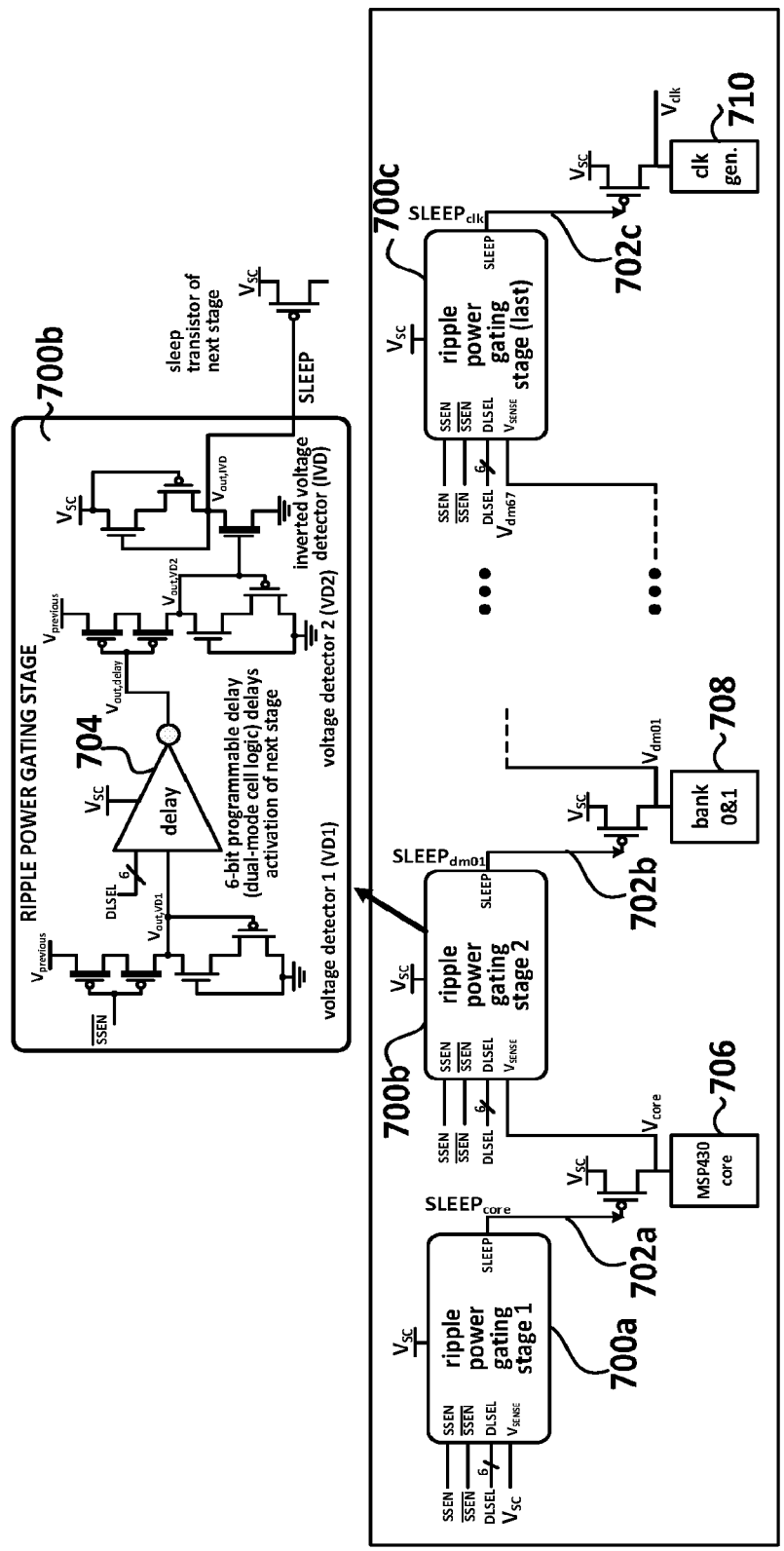
FIG. 7 shows a block diagram illustrating power management with ripple self-startup consisting of cascaded power gating stages for sequential activation of power domains, according to an example embodiment.

To solve this issue, a ripple power gating self-startup mechanism is introduced according to an example embodiment to advantageously allow cold start with limited harvested power. Instead of powering up the entire microcontroller system all at once, the microcontroller system is partitioned in smaller power domains that are sequentially powered by the ripple self-startup block 216 (FIG. 2), which progressively turns on the relevant header sleep transistors. The gate count in each power domain is preferably small enough to keep its power-up peak current lower than the minimum targeted harvested power, as set by the application (e.g., low illuminance in the solar cell 222, FIG. 2). Each ripple power gating stage e.g. 700b in FIG. 7 contains a hysteresis voltage detector VD1 that turns on the sleep transistor of the next stage after a delay, in this example a 6-bit programmable delay circuit 704 (tunable for testing purposes), when the input voltage into the ripple power gating stage e.g. 700 reaches a 250-mV trigger level, in this example embodiment.

Specifically, in the first ripple power gating stage 700a, when the harvester voltage $V_{SC}$ detected at VD1 reaches the 250-mV trigger level during self-startup, after the programmable delay VD2 is enabled. In turn, VD2 pulls up $V_{out,VD2}$, and as a result, the inverted voltage detector (IVD) pulls SLEEP 702a down to turn on the next sleep transistor, here of the MCU core domain 706. In the next ripple power gating stage 700b, when the MCU core domain voltage $V_{core}$ detected at VD1 reaches the 250-mV trigger level during, after the programmable delay VD2 is enabled. In turn, VD2 pulls up $V_{out,VD2}$, and as a result, the IVD pulls SLEEP 702b down to turn on the next sleep transistor, here of the MEM banks 0&1 708. In the last ripple power gating stage 700c, when the $V_{dm67}$ voltage detected at VD1 reaches the 250-mV trigger level during, after the programmable delay VD2 is enabled. In turn, VD2 pulls up $V_{out,VD2}$, and as a result, the IVD pulls SLEEP 702c down to turn on the next sleep transistor, here of the clock generator 710. It is noted that an instruction memory is not used in this self-start-up showcase according to an example embodiment, (even though it is provided as an extra feature according to example embodiments), however ROM (compare 206 in FIG. 2, containing a bootup program) is used.

Figure 8:
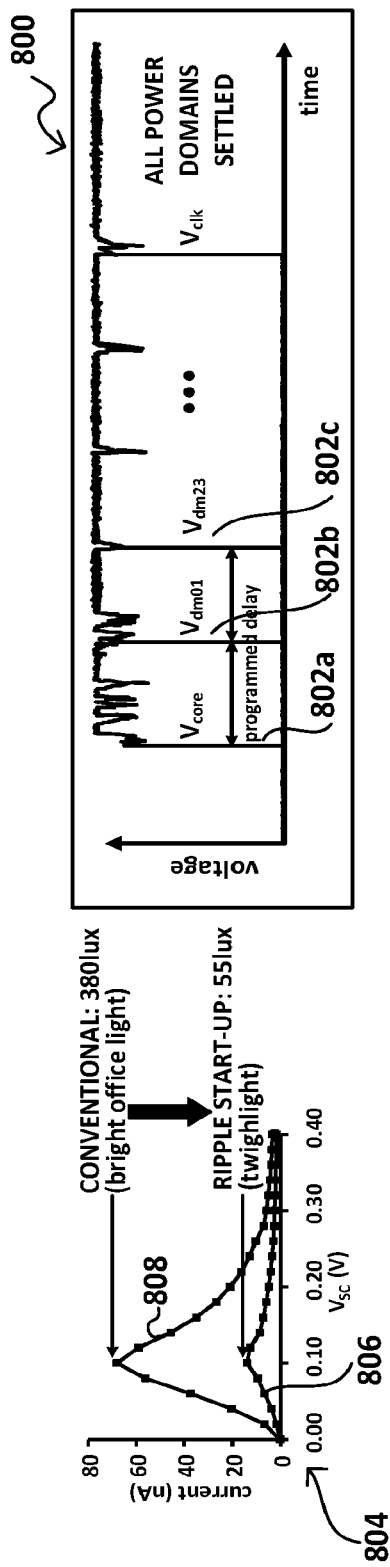
FIG. 8 shows graphs illustrating measured current (left) and sequence of enable signals activating the ripple self-startup stages (right) during a self-startup according to an example embodiment.

Graph 800 in FIG. 8 shows the measured waveform of signals e.g. 802a, 802b, 802c progressively activating the power domains during self-startup according to an example embodiment, as powered by an on-chip 0.54 mm² solar cell at 55 lux illuminance (as typical of twilight). In graph 804, curve 806 shows the current absorbed for a ripple start-up (i.e. one domain is turned on and added at a time, with the previous one being kept on and the next power gated) according to the example embodiment, powered by the on-chip 0.54 mm² solar cell at 55 lux illuminance. Without a conventional "all on" start-up, more than 380 lux would be needed for a safe start-up (bright office lighting), as shown in curve 808 in graph 804.

Compared to prior art, embodiments of the present invention provide a dual-mode architecture which can improve the minimum energy per gate by 5.5× and speed by five orders of magnitude compared with [1], while achieving an energy/gate that is comparable to [2-3] and lower than [5-6]. In sub-leakage operation, the dual-mode architecture according to an example embodiment can offer >780× improvement in minimum power/gate compared with [2-6], allowing the system according to an example embodiment to fully function at 55 lux light intensity with a 0.54 mm² on-chip solar cell.

Figure 9:
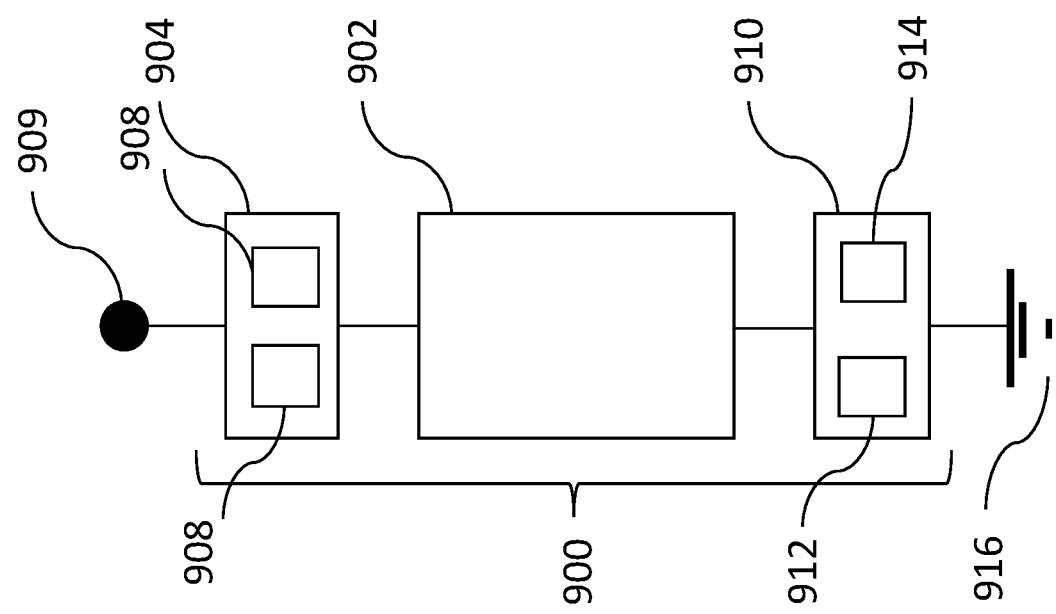
FIG. 9 shows a schematic drawing illustrating a cell logic structure for a battery-indifferent or pure energy harvesting multi-mode system, according to an example embodiment.

FIG. 9 shows a schematic drawing illustrating a cell logic structure 900 for a battery-indifferent or purely energy harvested multi-mode system, according to an example embodiment. The cell logic structure 900 comprises a CMOS gate circuit 902; a header circuit 904 coupled to the CMOS gate circuit and comprising first and second header transistors 906, 908 for coupling in parallel between a supply voltage 909 and the CMOS gate circuit 902; and a footer circuit 910 coupled to the CMOS gate circuit 902 and comprising first and second footer transistors 912, 914 for coupling in parallel between the CMOS gate circuit 902 and a ground voltage 916; wherein the header and footer circuits 904, 910 are configured for switching between different operation modes of the multi-mode system 900, the different operation modes chosen from a range from a normal mode in which feedback paths from an output of the CMOS gate circuit 902 to the gate of the second header transistor 908 and to the gate of the second footer transistor 914 are substantially or fully disabled for full swing in the output voltage of the CMOS gate circuit 902, and a leakage suppression mode in which the feedback paths are substantially or fully enabled.

The first and second header transistors 906, 908 may comprise NMOS transistors.

The first and second footer transistors 912, 914 may comprise PMOS transistors.

The header and footer circuits 904, 910 may be configured for disabling the feedback by overdriving the gates of the first header transistor 906 and the first footer transistor 912.

Figure 10:
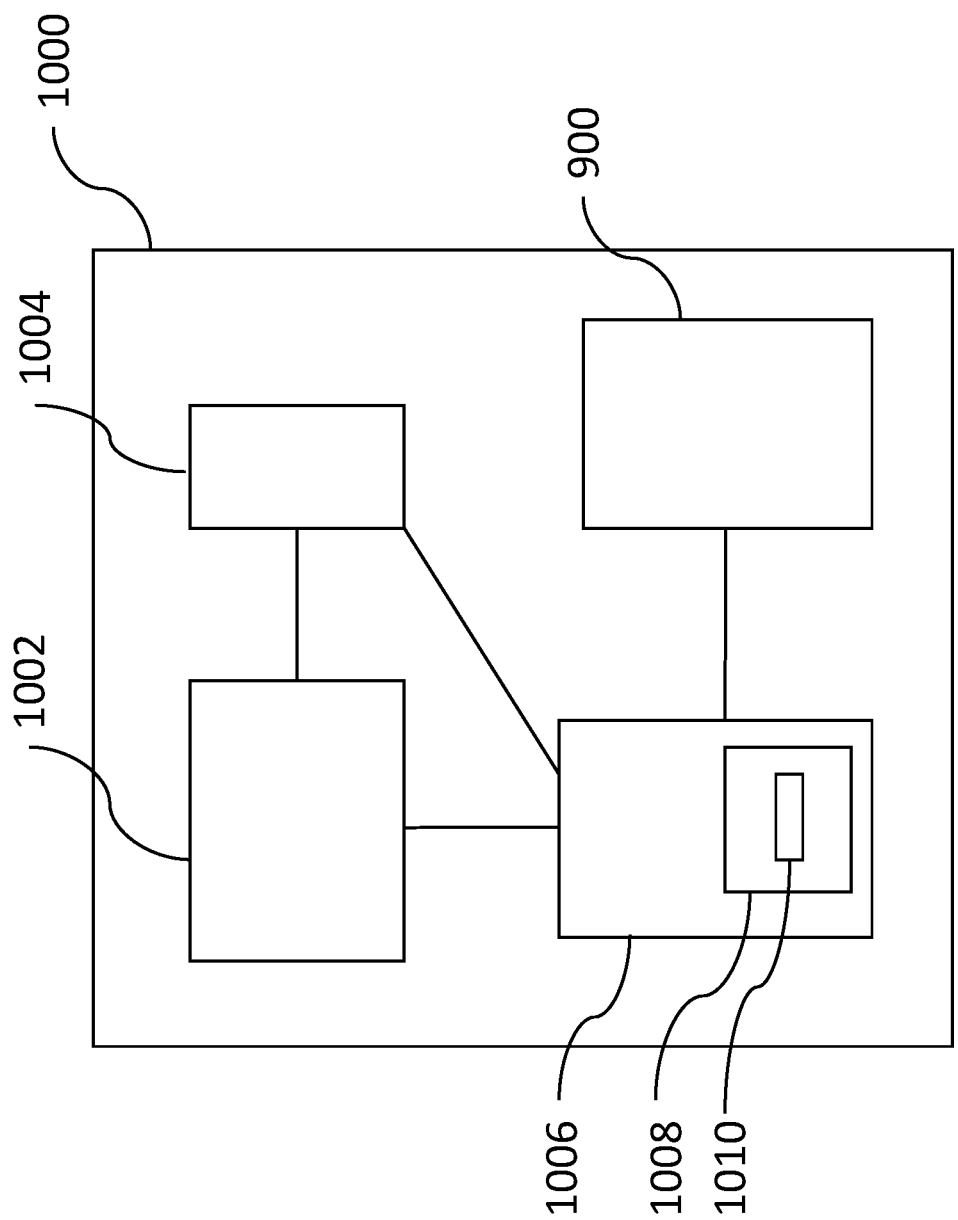
FIG. 10 shows a schematic diagram illustrating a battery-indifferent or pure energy harvesting multi-mode system, according to an example embodiment.

FIG. 10 shows a schematic diagram illustrating a battery-indifferent or purely energy harvested multi-mode system 1000, according to an example embodiment. The system 1000 comprises an energy harvesting circuit 1002 for generating power for the dual mode system; one or more cell logic structures 900 as described above with reference to FIG. 9; and a power management circuit 1006 switching between the different operation modes of the multi-mode system 1000.

The power management circuit 1006 may comprise a self-startup circuit portion 1008 for gradually powering up the multi-mode system 1000 after an outage of power generated by the harvesting circuit 1002.

The self-startup circuit portion 1008 may be configured to sequentially power up partitions of the multi-mode system 1000.

The self-startup circuit portion 1008 may comprise a delay circuit 1010 for introducing a delay between power up of the respective partitions.

The dual mode system may further comprise a battery 1004 configured to be recharged from the harvesting circuit, and the first level of power may be provided at least partially by the battery 1004, and the second level of power may be provided purely by the harvesting circuit 1002.

The first and second levels of power may be provided purely by different output levels of the harvesting circuit 1002.

Figure 11:
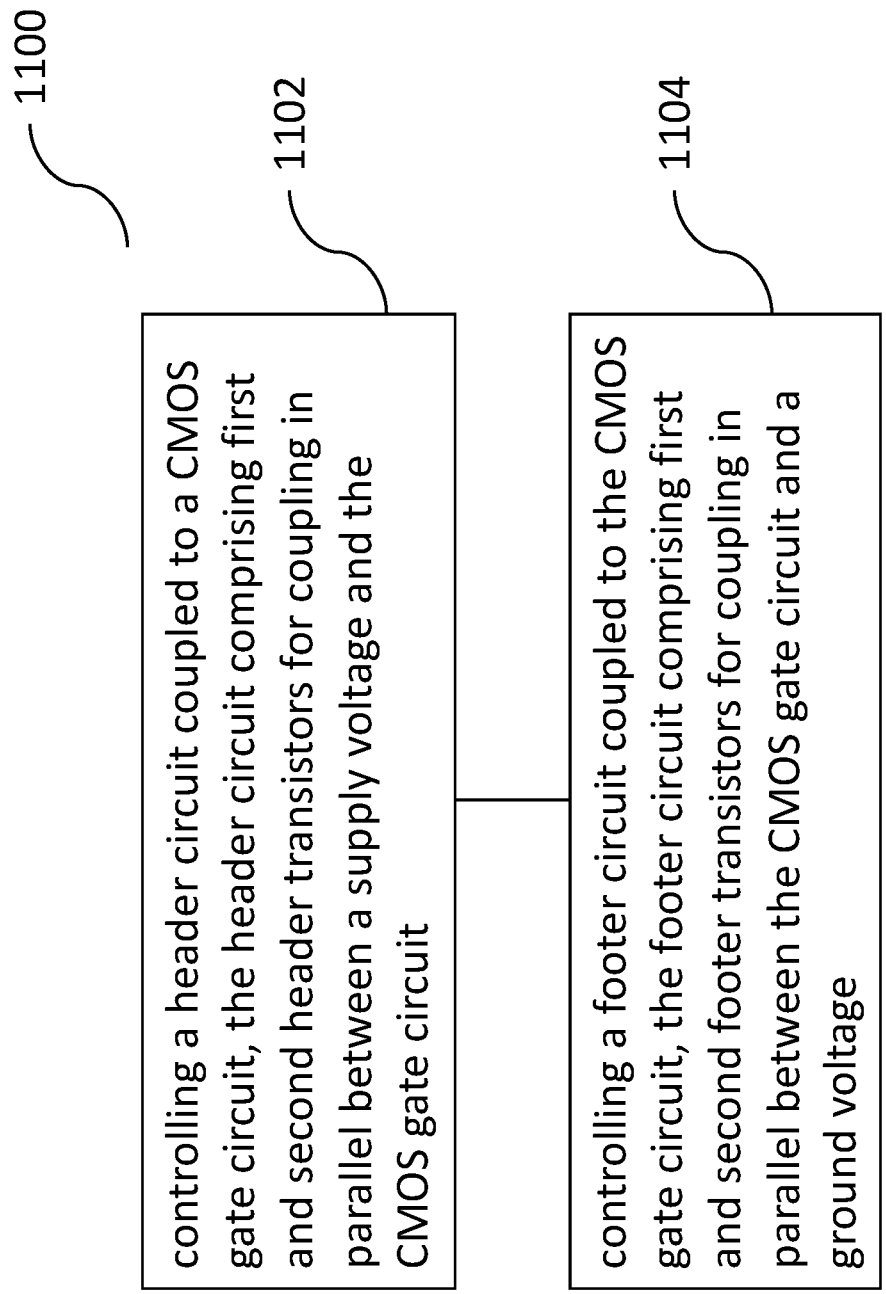
FIG. 11 shows a flow chart illustrating a method of operating a cell logic structure for a battery-indifferent or pure energy harvesting multi-mode system, according to an example embodiment.

FIG. 11 shows a flow chart 1100 illustrating a method of operating a cell logic structure for a battery-indifferent or purely energy harvested multi-mode system, according to an example embodiment. At step 1102, a header circuit coupled to a CMOS gate circuit is controlled, the header circuit comprising first and second header transistors for coupling in parallel between a supply voltage and the CMOS gate circuit, and at step 1104, a footer circuit coupled to the CMOS gate circuit is controlled, the footer circuit comprising first and second footer transistors for coupling in parallel between the CMOS gate circuit and a ground voltage; such that the multi-mode system is switchable between different operation modes, the different operation modes chosen from a range from a normal mode in which feedback paths from an output of the CMOS gate circuit to the gate of the second header transistor and to the gate of the second footer transistor are substantially or fully disabled for full swing in the output voltage of the CMOS gate circuit, and a leakage suppression mode in which the feedback paths are substantially or fully enabled.

The first and second header transistors may comprise NMOS transistors.

The first and second footer transistors may comprise PMOS transistors.

The method may comprise controlling the header and footer circuits for disabling the feedback by overdriving the gates of the first header transistor and the first footer transistor.

Figure 12:
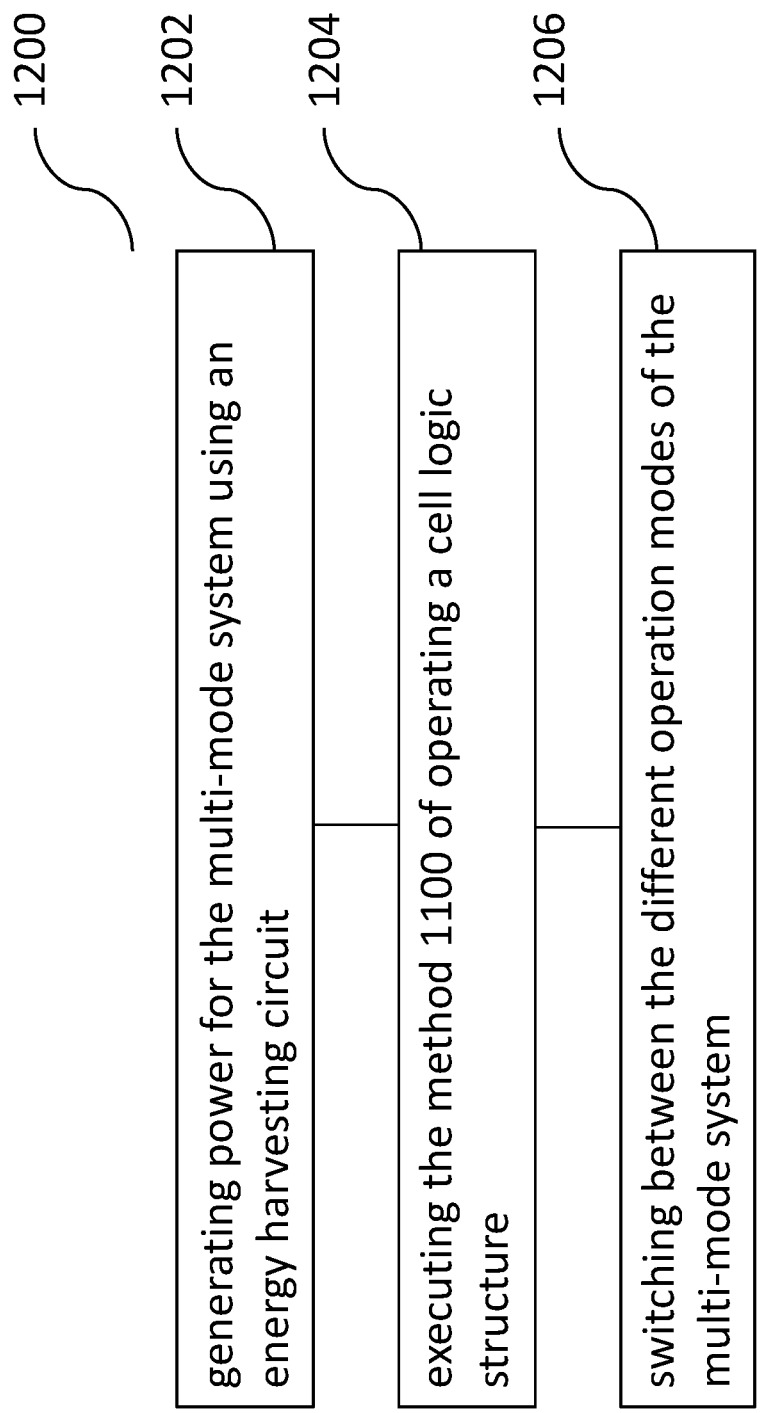
FIG. 12 shows a flowchart illustrating a method of operating battery-indifferent or pure energy harvesting multi-mode system, according to an example embodiment.

FIG. 12 shows a flowchart 1200 illustrating a method of operating battery-indifferent or purely energy harvested multi-mode system, according to an example embodiment. At step 1202, power for the dual mode system is generated using an energy harvesting circuit. At step 1204, the method 1100 of operating a cell logic structure is executed. At step 1206, the multi-mode system is switched between the different operation modes.

The method may comprise gradually powering up the multi-mode system after an outage of power generated by the harvesting circuit.

The method may comprise sequentially powering up partitions of the multi-mode system.

The method may comprise introducing a delay between power up of the respective partitions.

Embodiments of the present invention can have one or more of the following features and associated benefits/advantages:

| Feature | Benefit/Advantage |
| --- | --- |
| The ability to support dual-mode operations: normal mode and leakage suppression mode | The performance and energy efficiency are maximized in normal mode, while the power is minimized in leakage suppression mode (pushed below leakage power) |
| The ability to granularly adjust the starved current in logic gates | Graceful energy (speed) and power trade-off can be obtained to adapt to the changes of environments and requirements |

| Feature | Benefit/Advantage |
|---|---|
| The ability to power on each separate power domain sequentially during self-startup | The required harvested power for startup is greatly reduced, which avoids the need of kick-start as shown in [1] |

Embodiments of the present invention can have the following applications, by way of example, not limitation:
- provide a solution to operate at both minimum energy mode and minimum power mode, bridging the gap between battery-powered systems and purely harvested systems
- provides to a solution to cold start with limited harvested power, as opposed to kick-start in [1]

Aspects of the systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the system include: microcontrollers with memory (such as electronically erasable programmable read only memory (EEPROM)), embedded microprocessors, firmware, software, etc. Furthermore, aspects of the system may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

The elements and acts of the various embodiments described above can be combined to provide further embodiments. These and other changes can be made to the systems and methods in light of the above detailed description.

For example, the self-startup problem addressed by embodiments of the present invention also applies to DLS systems such as the DLS system described in [1]. In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

Also, while in the embodiments described above a battery and a battery charger are present, the present invention can also be applied to adjust the frequency-power tradeoff even in systems with only energy harvesting (no battery charge). In such embodiments, one can adapt to very different levels of available/delivered power from the harvester, which is useful as will be appreciated by a person skilled in the art.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

REFERENCES

[1] W. Lim, et al., "Batteryless Sub-nW Cortex-M0+ Processor with Dynamic Leakage-Suppression Logic," ISSCC, pp. 146-147, 2015.

[2] J. Myers, et al., "An 80 nW Retention 11.7 pJ/Cycle Active Subthreshold ARM Cortex-M0+ Subsystem in 65 nm CMOS for WSN Applications," ISSCC, pp. 144-145, 2015.

[3] D. Bol et al., "A 25 MHz 7 µW/MHz Ultra-Low-Voltage Microcontroller SoC in 65 nm LP/GP CMOS for Low-Carbon Wireless Sensor Nodes," ISSCC, pp. 490-491, 2012.

[4] S. Paul, et al., "A Sub-cm3 Energy-Harvesting Stacked Wireless Sensor Node Featuring a Near-Threshold Voltage IA-32 Microcontroller in 14-nm Tri-Gate CMOS for Always-ON Always-Sensing Applications," IEEE JSSC, vol. 52, no. 4, pp. 961-971, 2017.

[5] Y. Lee, et al., "A Modular 1 mm3 Die-Stacked Sensing Platform with Optical Communication and Multi-Modal Energy Harvesting," ISSCC, pp. 402-403, 2012.

[6] H. Reyserhove, et al., "A Differential Transmission Gate Design Flow for Minimum Energy Sub-10-pJ/Cycle ARM Cortex-M0 MCUs," IEEE JSSC, vol. 52, no. 7, pp. 1904-1914, 2017.

The invention claimed is:

1. A cell logic structure for a battery-indifferent or pure energy harvesting multi-mode system, the cell logic structure comprising:
  a CMOS gate circuit;
  a header circuit coupled to the CMOS gate circuit and comprising first and second header transistors for coupling in parallel between a supply voltage and the CMOS gate circuit; and
  a footer circuit coupled to the CMOS gate circuit and comprising first and second footer transistors for coupling in parallel between the CMOS gate circuit and a ground voltage;
  wherein the header and footer circuits are configured for switching between different operation modes of the multi-mode system, the different operation modes chosen from a range from a normal mode in which feedback paths from an output of the CMOS gate circuit to the gate of the second header transistor and to the gate of the second footer transistor are substantially or fully disabled for full swing in the output voltage of the CMOS gate circuit, and a leakage suppression mode in which the feedback paths are substantially or fully enabled; and wherein:

the header and footer circuits are configured for disabling the feedback by overdriving the gates of the first header transistor and the first footer transistor.

2. The cell logic structure of claim 1, wherein:

the first and second header transistors comprise NMOS transistors and the first and second footer transistors comprise PMOS transistor.

3. The cell logic structure of claim 1, wherein the first and second header transistors comprise NMOS transistors.

4. The cell logic structure of claim 1, wherein the first and second footer transistors comprise PMOS transistors.

5. A method of operating a cell logic structure for a battery-indifferent or pure energy harvesting multi-mode system, the method comprising the steps of:

controlling a header circuit coupled to a CMOS gate circuit, the header circuit comprising first and second header transistors for coupling in parallel between a supply voltage and the CMOS gate circuit, and controlling a footer circuit coupled to the CMOS gate circuit, the footer circuit comprising first and second footer transistors for coupling in parallel between the CMOS gate circuit and a ground voltage;

such that the multi-mode system is switchable between different operation modes, the different operation modes chosen from a range from a normal mode in which feedback paths from an output of the CMOS gate circuit to the gate of the second header transistor and to the gate of the second footer transistor are substantially or fully disabled for full swing in the output voltage of the CMOS gate circuit, and a leakage suppression mode in which the feedback paths are substantially or fully enabled; and wherein:

the header and footer circuits are configured for disabling the feedback by overdriving the gates of the first header transistor and the first footer transistor.

6. The method of claim 5, wherein:

the first and second header transistors comprise NMOS transistors and the first and second footer transistors comprise PMOS transistors.

7. The method of claim 5, wherein the first and second header transistors comprise NMOS transistors.

8. The method of claim 5, wherein the first and second footer transistors comprise PMOS transistors.

\* \* \* \* \*